United States Patent [19]
Blocker, III

[11] 3,969,745
[45] July 13, 1976

[54] INTERCONNECTION IN MULTI ELEMENT PLANAR STRUCTURES

[75] Inventor: Truman G. Blocker, III, Richardson, Tex.

[73] Assignee: Texas Instruments Incorporated, Dallas, Tex.

[22] Filed: Sept. 18, 1974

[21] Appl. No.: 507,021

[52] U.S. Cl. .................................. 357/22; 357/23; 357/55; 357/68; 357/71
[51] Int. Cl.² .................. H01L 29/80; H01L 29/06; H01L 23/48; H01L 29/46
[58] Field of Search .................. 357/23, 55, 22, 68, 357/71

[56] References Cited
UNITED STATES PATENTS 3,604,989  9/1971  Haneta et al. .................. 357/68
3,648,131  3/1972  Stuby .................. 357/68

*Primary Examiner*—Edward J. Wojciechowicz
*Attorney, Agent, or Firm*—Harold Levine; James T. Comfort; William E. Hiller

[57] ABSTRACT

A field effect transistor wherein at least one of source, drain and gate electrodes on a semiconductor substrate is a multi electrode array above a common conductor on the bottom of the substrate. A conductive connection between electrodes of the array and the common conductor is completed through holes in the substrate.

15 Claims, 10 Drawing Figures

INTERCONNECTION IN MULTI ELEMENT PLANAR STRUCTURES

This invention relates to planar structures where multi electrode elements on one surface are to be interconnected. In a more specific aspect, the invention relates to structures where holes in the substrate are metallized to connect to a common conductive layer at the bottom of the substrate to minimize parasitic capacitances and inductances to ground.

In the operation of integrated semiconductor systems at microwave frequencies of about 5.0 gigahertz and above, parasitic inductances and capacitances become of great significance. Attempts are made to minimize such extraneous impedances.

FET structures constructed to operate at microwave frequencies are generally fabricated on silicon or on gallium arsenide semiconductor substrates. In such systems, FETs generally are operated with the source at ground potential. This permits fabrication of an FET operable at microwave frequencies with minimization of parasitics that otherwise would be present.

FET structures heretofore have been manufactured with gates made relatively wide to increase the current capacity. In such structures, multi element drains, sources or gates may be employed. Elements of a given set, for example several source elements, have heretofore been connected by wires suitably bonded to interconnect the sources. In such cases, the inductance involved in the extended conductor lengths have involved parasitic inductances which in many instances cannot be tolerated.

The present invention involves structures such as FETs in which FET source, drain and gate electrodes are formed on one surface of a semiconductor substrate where at least one of the source and drain is a multi electrode array. The present invention involves interconnection of the elements of one such array through metallized holes formed in the substrate for establishing a connection to a common conductor sheet at the bottom of the substrate.

The novel features believed characteristic of the invention are set forth in the appended claims. The invention itself, however, as well as further objects and advantages thereof, will best be understood by reference to the following detailed description of an illustrative embodiment taken in conjunction with the accompanying drawings in which:

Figure 1:
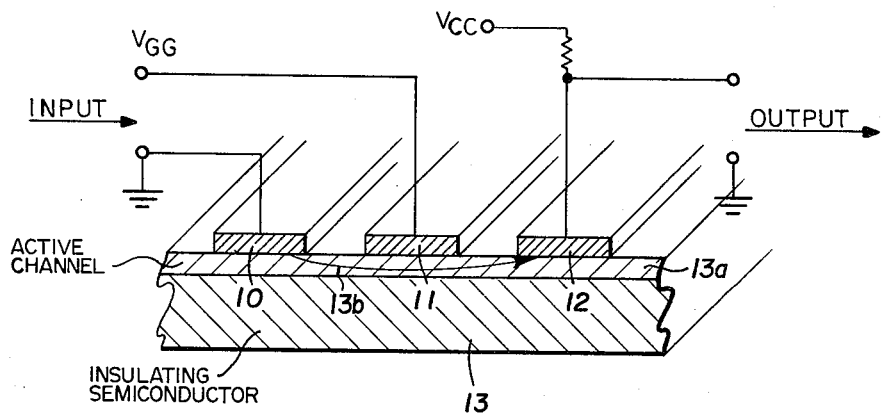
FIG. 1 is a simplified representation of a field effect planar transistor.

In FIG. 1 a planar field effect transistor (FET) is illustrated in which a source electrode 10, a gate electrode 11 and a drain electrode 12 are formed on the surface of a semiconductor substrate 13. The substrate 13 is typically composed of a thin active channel 13a on a thick insulating slab of the semiconducting material. The semiconductor material may be silicon or it may be gallium arsenide. The source electrode 10 makes ohmic contact with the active channel 13a. Where FETs are formed in gallium arsenide substrates, the gate electrode 11 may be of the Schottky barrier type. Alternatively, the gate may be formed on top of an insulating layer in metal oxide semiconductor (MOS) units. Drain electrodes 12 make ohmic contact with the surface of active layer 13a. As indicated in FIG. 1, wide gate FETs are provided by extending the length of the parallel electrodes 10, 11 and 12. Current flow between source electrode 10 and drain electrode 12 generally follows the path 13b in layer 13a. The current is controlled by varying the signal voltage on gate 11. Source electrode 10 is normally grounded. Gate electrode 11 is connected to the signal source which may include a bias source $V_{GG}$. The drain electrode 12 is connected to a potential source $V_{CC}$ and provides an output signal representing voltage drop due to current flow through a load impedance.

Radio frequency input signals may then be applied at the input between the gate and grounded source. An amplified output signal appears at the drain output circuit. It is to such devices that the present invention pertains.

Figure 2:
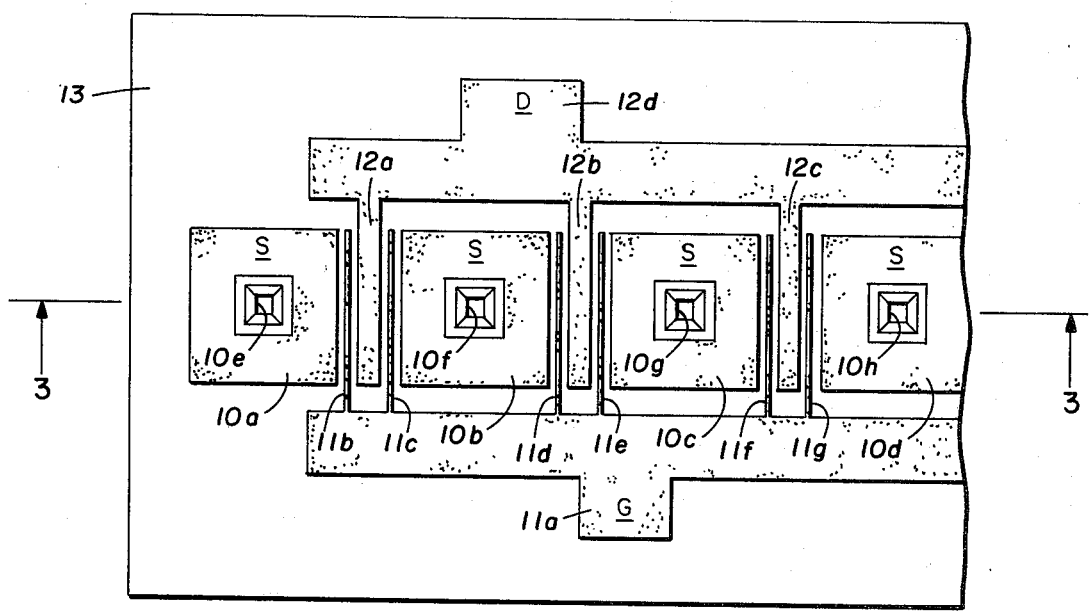
FIG. 2 is a top view of a multi element planar field effect transistor embodying the present invention.

In FIG. 2, a wide gate FET has been illustrated with the source comprising a multiplicity of separate elements. More particularly, the source elements 10a, 10b, 10c, 10d, etc. are formed on the surface of a semiconductor substrate 13. They are spaced apart one from another with drain electrodes extending as fingers in the zone between confronting edges of the adjacent source electrodes 10a–10d. More particularly, a drain 12a extends between source electrodes 10a and 10b. Drain 12b extends between source electrodes 10b and 10c. The system can be extended further with additional sets of electrodes. However, for the purpose of the present description, only four sources are illustrated. The fingers 12a, 12b and 12c are integral with a drain pad 12d.

In a similar manner, a gate pad 11a is provided with fingers extending in each zone between a source and a drain. More particularly, finger 11b extends between source 10a and drain 12a. Finger 11c extends between source 10b and drain 12a. Finger 11d extends between source 10b and drain 12b. Gate 11e extends between source 10c and drain 12b, gate 11f lies between source 10c and drain 12c and gate 11g lies between source 10d and drain 12c.

It will be apparent from inspection of FIG. 2 that it is not possible to interconnect the sources 10a, 10b, 10c, and 10d by planar metallization on the surface of the substrate 13 without overlaying gate or drain electrodes. Heretofore, bond wires have been employed to provide interconnects between elements such as sources 10a–10d, since close overlapping of metal contacts as is done in integrated circuits results in intolerable parasitic capacitances. The practice has been to connect both extremities of a given bond wire to a ground plane conductor and then to loop the interconnecting wire high above the substrate 13 and thus well above the conductive paths forming the gate and drain electrodes, bonding the wire to the several source electrodes.

Figure 3:
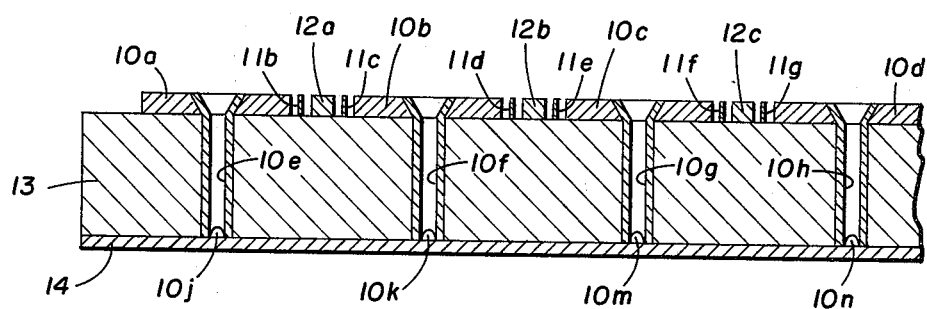
FIG. 3 is a sectional view taken along lines 3—3 of FIG. 2.

In contrast with prior practice and in accordance with the present invention, interconnections between the source electrodes are formed through holes extending through the semiconductor substrate 13 to make contact with a metallization layer on the bottom of the substrate 13. More particularly, as shown in FIG. 2, holes 10e–10h extend through substrate 13 from the center of each of the source electrodes 10a–10d, respectively. As shown in FIG. 3, the inner surfaces of the holes 10e–10h are metallized and electrically connected as by way of solder connections 10j–10n, respectively, to a metal layer 14 on the bottom of substrate 13. By this means, the interconnection is completed between the source electrodes 10a–10c without overlap structures being required.

The above interconnections result in minimum parasitic capacitances to ground. They provide the lowest possible D.C. and RF resistance connections to ground. They provide for improved heat sinking. That is, heat generated in or near the upper surface of the substrate 13, particularly near the gates, can be dissipated by flow through the higher thermal conductivity path formed by the material lining or filling the holes 10g–10h. Thus, the present invention permits manufacture of an RF amplifier, for example, of greatly increased performances characteristics.

Prior procedures of bonding separate wires to each of the pads to be interconnected are eliminated. It also provides greater insurance as to uniformity of interconnects as between successive devices.

Figure 4:
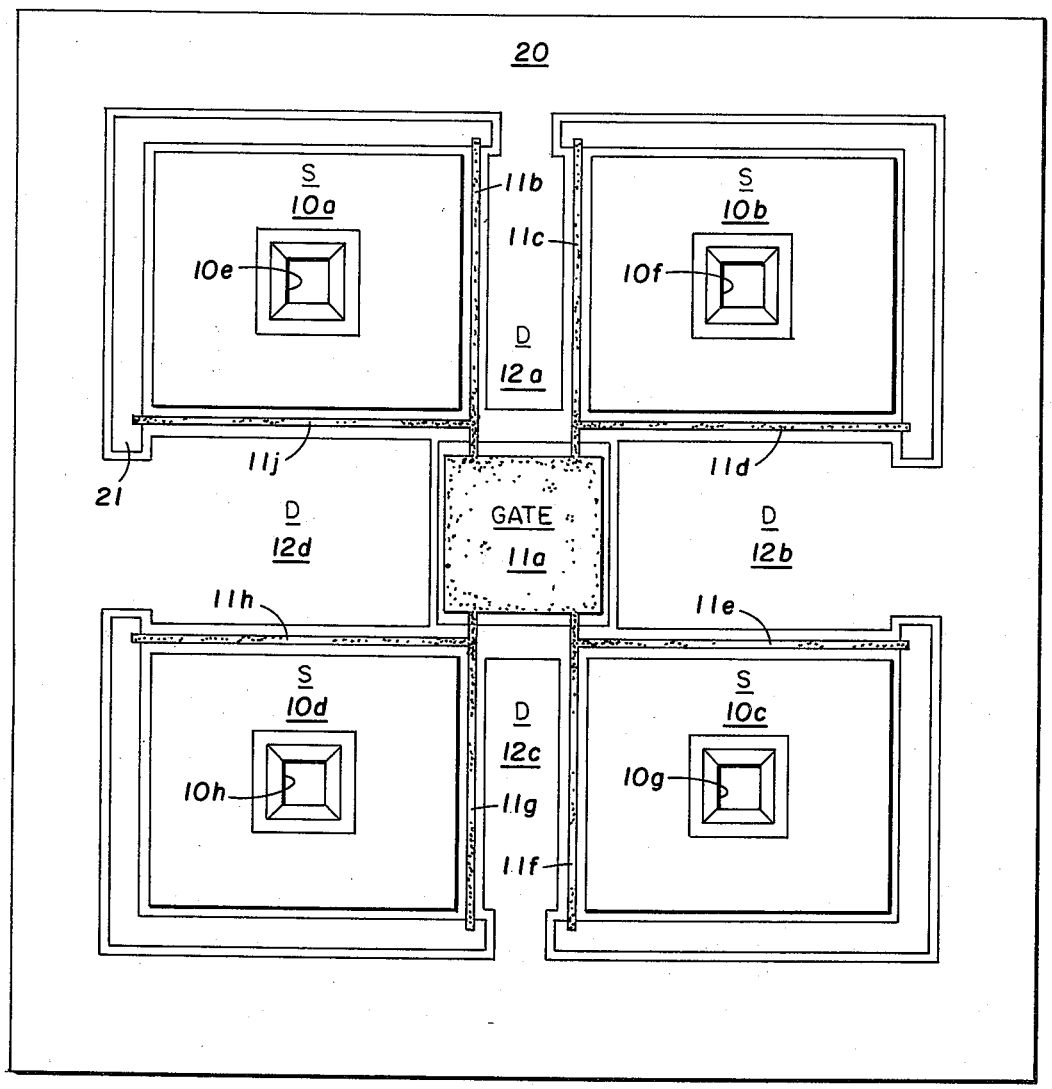
FIG. 4 illustrates an alternative form of an embodiment of the invention.

In FIG. 4, an FET of geometry differing from that of FIG. 2 has been illustrated. In this embodiment, a rectangular configuration is involved thereby minimizing the device area for a given gate width. In this system, the source electrodes 10a–10d are of rectangular configuration located adjacent the corners of a substrate 20. A square gate pad 11a is located at the center of substrate 20. Gate pad 11a is formed in a shallow well surrounded by mesa on which the source electrodes 10a–10d are formed and on which the drain electrodes 12a–12d are formed. Gate electrodes 11b–11j extend from the gate pad 11a up onto the mesa on which the source and drain pads are located. The gate electrodes are of length adequate to extend into wells of L shape which bound the outer perimeter of the source electrodes 10a–10d. By way of example, gate electrode 11j extends into the well 21 which extends along two sides of the source electrode 10a. In each case, the source electrode is pierced by a hole for accommodating metallization connections through to the metal layer on the bottom of the substrate 20. Thus, holes 10e–10h are formed through electrodes 10a–10d.

The well in which the gate pad 11a is disposed and the surrounding wells such as well 21 have a depth such that they serve as isolation regions between the source and drain except for the regions on which the gate is formed.

FIGS. 5–10 illustrate a further modification of the invention, a proton insulated FET with source ground interconnects. FIGS. 5–10 will also indicate successive process steps employed in fabrication.

Figure 5:
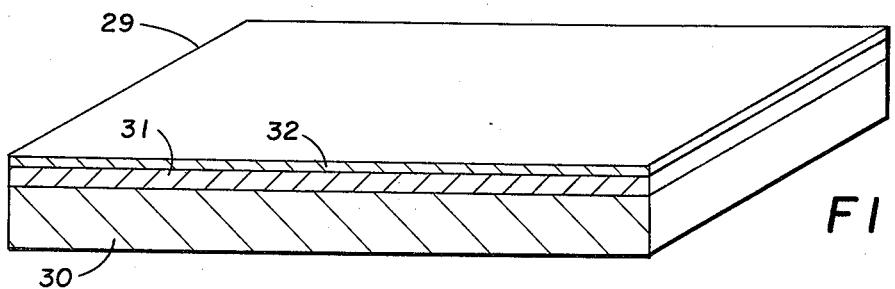
FIGS. 5–10 illustrate successive steps in the fabrication of a multi element planar field effect transistor embodying the present invention.

In FIG. 5, the starting structure shown is a three layer composite semiconductor body 29. Body 29 includes a bottom layer 30 which is a conducting substrate such as gallium arsenide. The resistivity of layer 30 preferably is of the order of $10^{-2}$ ohm centimeters.

A middle layer 31 is of semi insulating semiconductor material having resistivity of the order of about $10^8$ ohm centimeters. Layer 30 may be of the order of 0.003 inch thick. The top layer 32 is a conducting FET channel, an N+ doped surface layer such as formed by epitaxial techniques. Layer 32 preferably has a thickness of the order of ¼ micron and a resistivity of $10^{-2}$. The layer 31 may be of the order of 5 microns thick.

Figure 6:
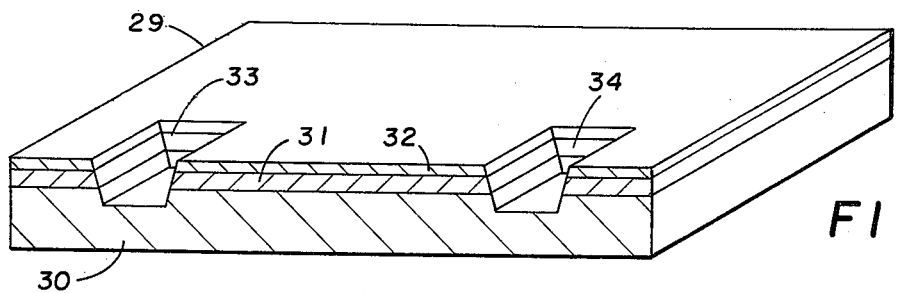

In FIG. 6, the first step in forming a multi element FET having interconnects embodied in the present invention has been illustrated where two relatively shallow holes 33 and 34 have been etched. Both holes will serve as source holes.

Figure 7:
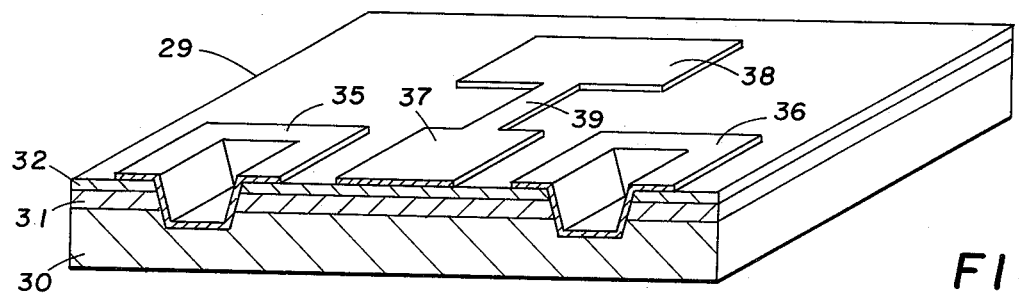

In FIG. 7, source-drain metallization is shown as having been applied to form the source electrodes 35 and 36 which are now automatically interconnected by reason of the extension thereof into contact with the conducting substrate 30. Drain electrode 37 is formed on the surface of the substrate 29 with a drain pad 38 connected thereto by way of an arm 39.

Figure 8:
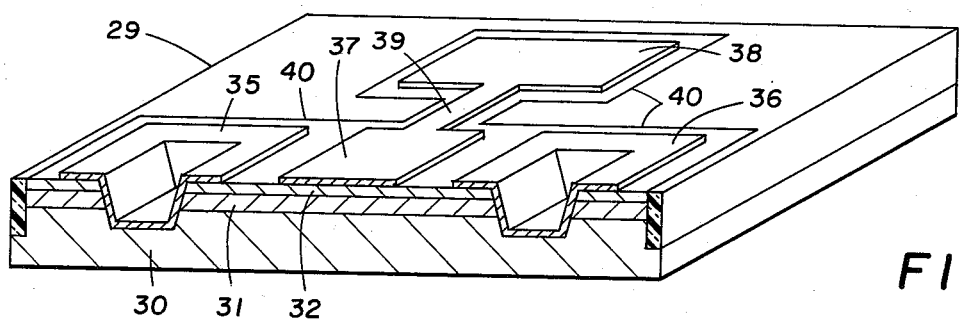

FIG. 8 illustrates a boundary 40 which completely encompasses the electrodes 35, 36, 37, pad 38 and arm 39 with a uniform spacing between the boundary 40 and the external perimeters of the pads and the arm 39. The surface layer 32 outside of the boundary 40 is rendered nonconductive. One way to render the area outside of boundary 40 nonconducting is to bombard the area with high energy protons. Damage resulting from such bombardment to the lattice in both layers 31 and 32 renders them nonconductive.

Another way that this effect can be achieved is through the conventional etching into layer 31 so that the metallization illustrated in FIG. 8 would be left on a mesa formed by the etching process.

Figure 9:
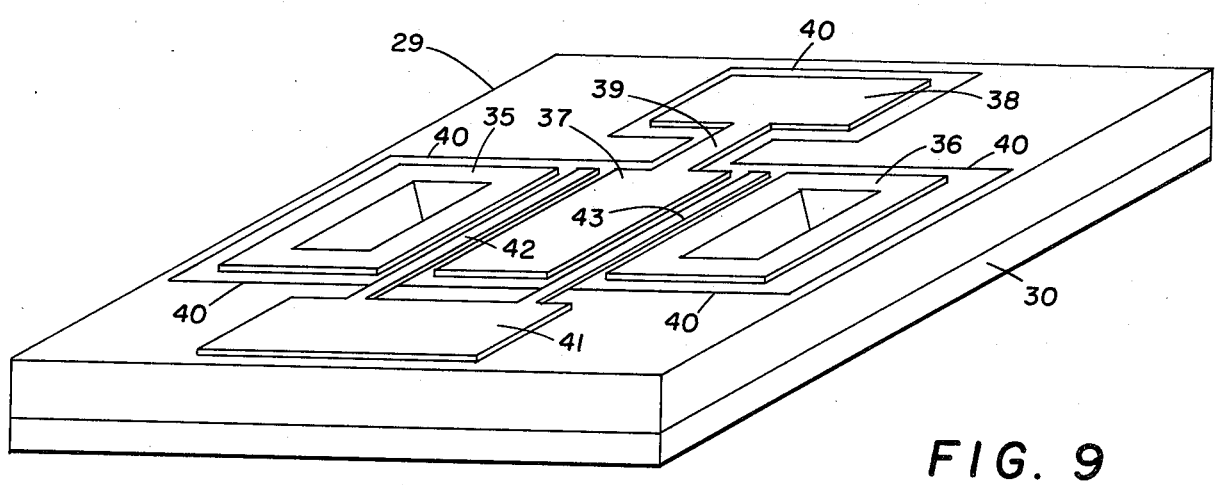

In FIG. 9 the addition of the gate metallization has been illustrated where the gate pad 41 is placed on the area outside the boundary 40 with the gate electrodes 42 and 43 extending in the space between source 35 and drain 37 and the space between source 36 and drain 37, respectively. Gates 42 and 43 extend beyond the perimeter 40 in the region of the pad 41.

Figure 10:
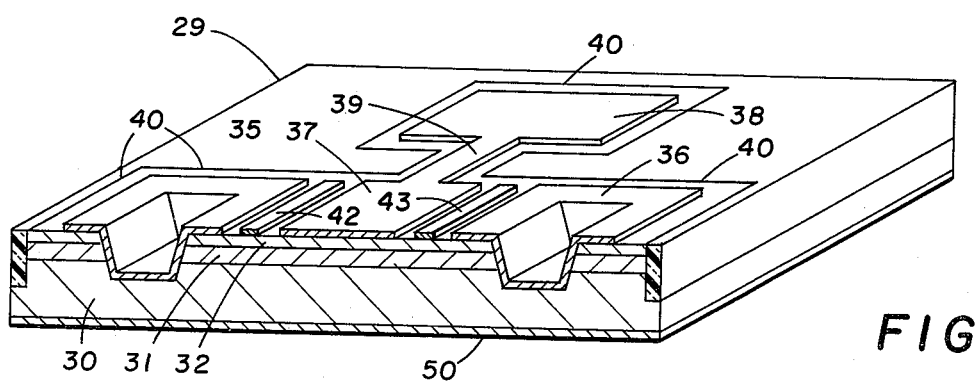

In FIG. 10, the final step has been illustrated by the addition of a metallization layer 50 on the bottom of layer 30 to complete the device.

It is clear that this simple double source device can be extended to devices with a large number of source pads with no modification in the described process.

From the foregoing, it will be seen that the present invention provides a wide gate field effect transistor in which a plurality of isolated source, drain and gate regions are formed in a semiconductor chip having a conductive layer at the bottom thereof. An electrode array on the surface contacts the drain region and a gate electrode on the surface overlays the gate regions. A plurality of electrodes on the surface contact the source regions and connect through the chip to the conductive layer at the bottom thereby providing source interconnections of minimal length and optimum geometry.

In FIG. 3, the holes extend through the semiconductor chip with metallization in the holes either completely filled or merely having surface metallization extending into and making electrical contact with the bottom metallic layer on the chip. In accordance with the system of FIG. 10, the holes are relatively shallow wells extending from the surface source electrodes through the surface layers of the chip to a lower layer of material that has been rendered conductive by doping.

In the system illustrated in FIG. 2, the FET regions are located in the chip in a geometrical order of source, gate, drain, gate, source, etc. Terminal pads on the same surface as the electrodes are connected to the gate and drain electrodes, respectively. A terminal pad on the bottom of the chip is connected to the source electrodes. It will be apparent that in FIG. 3 the geometrical order may be extended linearly as for example, source, gate, drain, gate, source, gate, drain, gate, source, gate, drain, etc. In the embodiment illustrated in FIG. 4, the order is extended in a rectangular pattern in which the gate terminal pad is central to the rectangular array and in which the drains are interconnected by a perimetral electrode band which interconnects the drain electrodes.

In the system illustrated in FIG. 4, the source and drain electrodes are located on a mesa on the chip with the gate electrodes extending across the mesa. In the embodiment of FIG. 10, the source, gate and drain electrodes are formed on a planar surface and the total array is bounded by a zone whose crystal structure has been altered to produce high resistivity by proton bombardment. In this embodiment, the gate electrodes extend across the boundary of the altered zone to insure that unwanted leakage between source and drain will not occur.

It will be apparent that other modifications may now be made and it is intended to cover such modifications as fall within the scope of the appended claims.

What is claimed is:

1. A field effect transistor comprising:
    substrate means including a body of semiconductor material having an active region forming one surface thereof,
    source, drain and gate electrodes disposed in spaced relationship to each other on said one surface of said semiconductor body with said gate electrode being interposed between said source and drain electrodes,
    at least one of said source and drain electrodes being a multi-electrode array including a plurality of electrodes arranged in spaced relation to each other on said one surface of said semiconductor body,
    said substrate means including a common conductor located in remote insulated relation to said one surface of said semiconductor body, and
    conductive connections between each of said plurality of electrodes included in said array and said common conductor, said conductive connections extending through said active region and at least partially through the remainder of said semiconductor body to electrically connect each of said plurality of electrodes included in said array to said common conductor.

2. A field effect transistor as set forth in claim 1, wherein said multi-electrode array comprises a plurality of source electrodes.

3. A field effect transistor as set forth in claim 1, wherein said semiconductor body is provided with a plurality of holes opening onto said one surface thereof into registration with each of said plurality of electrodes included in said multi-electrode array, and said conductive connections are metallized bodies extending into the holes in said semiconductor body and electrically connecting each of said plurality of electrodes included in said array to said common conductor.

4. A field effect transistor as set forth in claim 3, wherein the holes extend completely through said semiconductor body, and said common conductor is a conductive metal layer disposed on the surface of said semiconductor body opposite from said one surface thereof.

5. A field effect transistor as set forth in claim 3, wherein said common conductor is an electrically conductive region of said semiconductor body into which the holes extend.

6. A field effect transistor comprising:
    substrate means including a body of semiconductor material having an active region forming one surface thereof in which a plurality of isolated source, drain and gate regions are provided,
    respective gate regions being interposed between corresponding source and drain regions,
    interconnected drain electrodes on said one surface contacting said drain regions,
    interconnected gate electrodes on said one surface overlaying said gate regions,
    a plurality of discrete source electrodes on said one surface contacting said source regions,
    said substrate means including a common conductor located in remote isolated relation to said one surface, and
    conductive means electrically connecting each of said plurality of discrete source electrodes to said common conductor, said conductive means extending through said active region and at least partially through the remainder of said semiconductor body.

7. A field effect transistor as set forth in claim 6, wherein said semiconductor body is provided with a plurality of holes opening onto said one surface thereof into registration with each of said plurality of discrete source electrodes, and said conductive means comprising individual metallized bodies extending into the holes in said semiconductor body and electrically connecting each of said plurality of discrete source electrodes to said common conductor.

8. A field effect transistor as set forth in claim 7, wherein the holes extend completely through said semiconductor body, and said common conductor is a conductive metal layer disposed on the surface on said semiconductor body opposite from said one surface thereof.

9. A field effect transistor as set forth in claim 7, wherein said semiconductor body has an electrically conductive region of doped semiconductor material remotely located with respect to said one surface thereof and into which the holes extend, said electrically conductive region of said semiconductor body comprising said common conductor, and said metallized bodies extending into the holes being metal wells respectively integral with the corresponding one of said plurality of discrete source electrodes.

10. A field effect transistor as set forth in claim 6, wherein the plurality of isolated source, drain and gate regions provided in the active region of said semiconductor body are arranged in the geometrical order of source, gate, drain, gate, source, and further including terminal pads on said one surface respectively interconnecting said drain electrodes and interconnecting said gate electrodes.

11. A field effect transistor as set forth in claim 10, wherein said geometrical order of isolated source, drain and gate regions is repeated in a linear pattern to include at least two drain regions.

12. A field effect transistor as set forth in claim 10, wherein said geometrical order of isolated source, drain and gate regions is repeated in a rectangular pattern including drain and source regions alternating in a clockwise direction about a central region with respective gate regions interposed between respective drain and source regions.

13. A field effect transistor as set forth in claim 12, wherein said terminal pad interconnecting said gate electrodes is disposed in said central region of said rectangular pattern of isolated source, drain and gate regions on said one surface, and said terminal pad for said drain electrodes comprises a perimetral band interconnecting said drain electrodes.

14. A field effect transistor as set forth in claim 13, wherein the active region of said semiconductor body forming said one surface thereof includes a mesa elevated above the central region of said rectangular pattern in which said terminal pad for said gate electrodes is disposed, and said source, gate and drain electrodes being located on said mesa.

15. A field effect transistor as set forth in claim 6, wherein said one surface on which said source, gate and drain electrodes are disposed is a planar surface, said planar surface including a high resistivity zone bounding said source, gate and drain electrodes, and a terminal pad interconnecting said gate electrodes and disposed on said high resistivity zone.

\* \* \* \* \*